United States Patent [19]

Rollins et al.

[11] Patent Number: 5,036,217
[45] Date of Patent: Jul. 30, 1991

[54] HIGH-SPEED LOW-POWER FLIP-FLOP

[75] Inventors: Norman T. Rollins, Plantation, Fla.; Gianfranco Gerosa, Austin, Tex.

[73] Assignee: Motorola, Inc., Schaumburg, Ill.

[21] Appl. No.: 360,819

[22] Filed: Jun. 2, 1989

[51] Int. Cl.$^5$ .................... H03K 3/284; H03K 3/289
[52] U.S. Cl. .................. 307/272.2; 307/291; 377/117
[58] Field of Search .................. 307/272.2, 279, 288, 307/247.1, 291, 292; 377/74, 79, 115, 116, 117, 127, 105

[56] References Cited

U.S. PATENT DOCUMENTS

| | | | |
|---|---|---|---|
| 3,539,836 | 12/1966 | Seelbach | 307/247.1 |
| 3,728,561 | 4/1973 | Brocker | 307/247.1 |
| 4,484,087 | 11/1984 | Mazin | 377/79 |
| 4,626,706 | 12/1986 | Allen | 307/291 |
| 4,656,368 | 4/1987 | McCombs | 307/272.2 |
| 4,913,007 | 3/1980 | Tietz | 307/291 |

Primary Examiner—Stanley D. Miller
Attorney, Agent, or Firm—Michael J. Buchenhorner

[57] ABSTRACT

A master-slave flip-flop having a first bistable cell and a control circuit coupled to that first cell for changing the binary state of the cell in response to a set of complementary data inputs and a clock signal. The slave portion of the flip-flop includes a second bistable cell that is coupled to the first cell and a second control circuit for changing the state of the second cell in response to the output of the first cell and to a clock signal. The flip-flop is intended to be implemented using CMOS technology, and is capable of performing at frequencies greater than a gigahertz with low power consumption. The circuit configuration is highly symmetric, so that the master and slave portions may be interchanged.

36 Claims, 4 Drawing Sheets

HIGH-SPEED LOW-POWER FLIP-FLOP

TECHNICAL FIELD

This invention relates generally to flip-flops for use in high-frequency applications and more particularly to flip-flops that may be implemented with complementary metal-oxide-semiconductor (CMOS) integrated circuit (IC) technology.

BACKGROUND ART

Traditionally in frequency synthesis systems, Si bipolar or GaAs technology is used for high-frequency circuits, such as prescalars, while CMOS technology is used for lower frequency circuits, such as phase-locked loops. This mixture of different technologies requires costly interface circuits. BiCMOS technology (wherein both bipolar and CMOS transistors are integrated on the same IC) offers a possible solution, but generally at a higher cost, using contemporary fabrication processes. As CMOS dimensions continue to scale down, however, high-frequency CMOS circuits may be designed and integrated with lower frequency CMOS circuits on the same IC simplifying system interfaces and reducing system costs.

In "Multigigahertz CMOS Dual-Modulus Prescalar IC", Hong-Ih Cong, et al., IEEE Journal of Solid State Circuits, October 1988, a low-power CMOS dual-modulus prescalar IC is described. That circuit, although effective at high frequencies, has a high power drain due to contention problems at several nodes. Such contention problems occur in circuits when one circuit device is attempting to pull a node toward a certain logic state, another circuit element is attempting simultaneously to pull the node to the opposite logic state. Such contention problems cause greater current (and hence power) drain. Power drain problems are highly undesirable in portable radio applications because of the restraints on the battery contained therein.

SUMMARY OF THE INVENTION

Accordingly, it is an object of the present invention to avoid the high power drain problems present in circuits such as the Cong et al. circuit. It is a further object of the present invention to provide a dynamic flip-flop for use in high-frequency applications such as a prescalar in a frequency modulation radio receiver. It is another object of the invention to provide a high-frequency CMOS flip-flop that may be integrated with lower frequency CMOS circuits on the same IC.

Briefly, according to the invention, a flip-flop comprises a first bistable cell with first and second complementary outputs (i.e., the first and second outputs are in complementary logic states). According to one aspect of the invention, the first bistable cell is dynamic. A first control means is provided for changing the binary state of the first bistable cell. The first control means comprises: (1) a first input means for receiving data; (2) a second input means for receiving the complement of the data received by the first input means; and (3) a first enabling means for receiving a clock signal. Accordingly, the first control means, when enabled by the first enabling means, may change the state of the first cell in response to inputs received by the foregoing input means.

The flip-flop of the invention also comprises a second bistable cell which also has complementary outputs. That second cell is controlled by a second control means which changes the state of the second cell in response to the outputs of the first cell and the clock signal. The second control means comprises: (1) a third input means for receiving a signal from the first output of the first cell; (2) a fourth input means for receiving a signal from the second output of the first cell; and (3) a second enabling means for receiving a clock signal. According to another aspect of the invention the second cell is dynamic; whereas the first cell may, or may not, be dynamic.

DETAILED DESCRIPTION OF THE PREFERRED EMBODIMENT

Figure 1A:
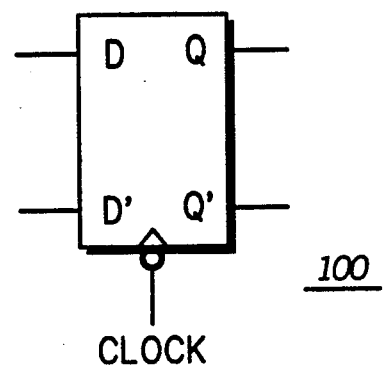
FIG. 1A is an icon for the new flip-flop.

Referring to FIG. 1A, the icon for a flip-flop 100 in accordance with the invention is shown. The subject flip-flop is D-type having an input coupled to receive data D and the complement of that data (D') and having output Q and its complement (Q').

Figure 1B:
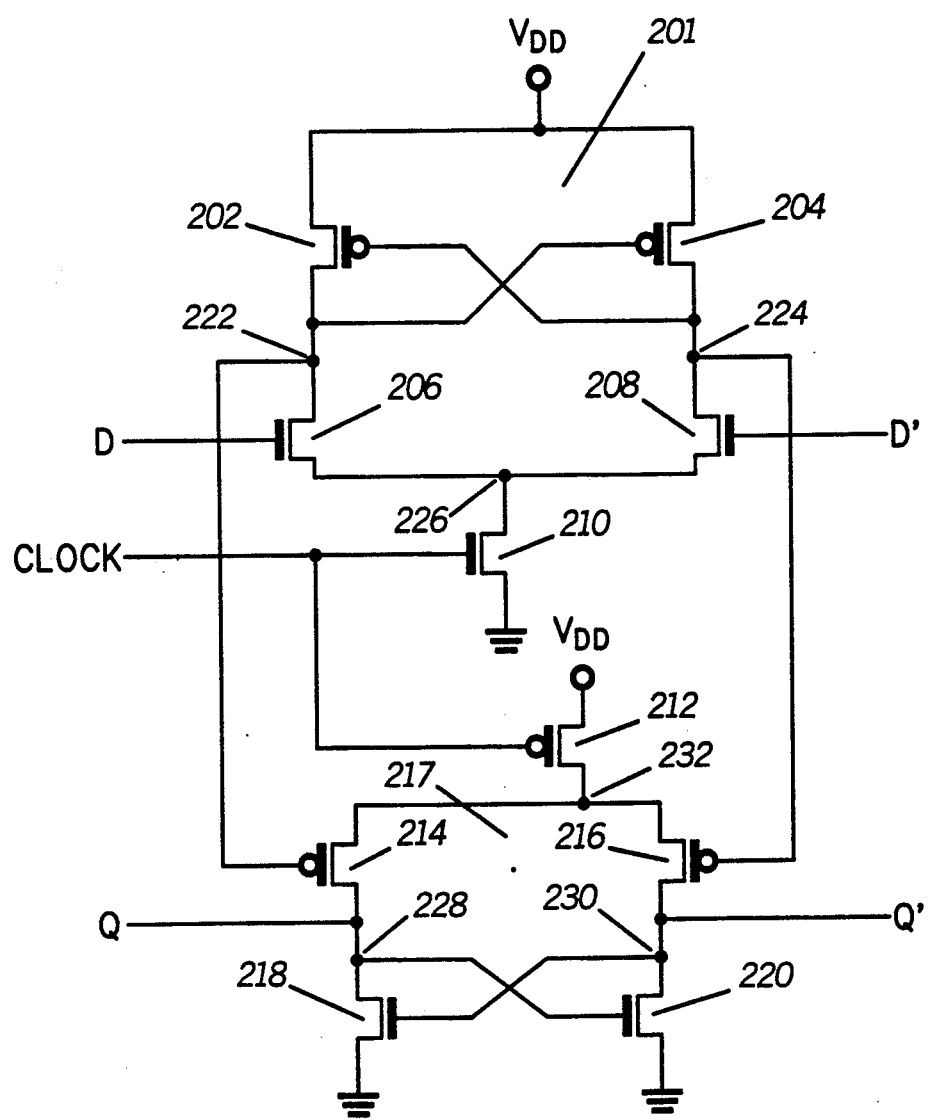
FIG. 1B shows a circuit diagram of a preferred embodiment of the invention in a D-type configuration.

Referring to FIG. 1B, a CMOS dynamic, master-slave D-type flip-flop circuit 200 is shown. In a preferred embodiment, a first bistable cell 201 comprises a pair of cross-coupled p-channel field effect transistors (FETs), 202 and 204, having their sources coupled together to voltage source, VDD. The gate of FET 202 is coupled to the drain of FET 204 at a common node 224 and the gate of FET 204 is coupled to the drain of FET 202 at a common node 222. A first output of the bistable cell 201 is supplied at node 222, and a second output is supplied at node 224. The data provided at the first output is the complement of the data provided at the second output.

FETs 206 and 208, and 210 are used to change the binary state of the bistable cell 201 in response to data signals, D and D', and a clock signal. The drain of FET 206 is coupled to first output node 222; and the drain of FET 208 is coupled to second output node 224. FET 206 has its gate coupled to receive the data signal, D, and FET 208 has its gate coupled to receive D'. The sources of FET 206 and FET 208 are coupled to a common node 226. A FET 210 has its gate coupled to receive the clock signal, its drain coupled to node 226, and its source grounded. In the preferred embodiment FETs 206, 208 and 210 are n-channel (i.e., the complement of the type of FET used in the first bistable cell). The circuit comprising FETs 202, 204, 206, 208, and 210 is the "master" portion of flip-flop 200.

The binary state of a second dynamic bistable cell 217 is controlled by the part of the flip-flop comprising FETs 212, 214, and 216. FET 214 has its gate coupled to first output node 222 and FET 216 has its gate coupled to second output node 224. The sources of FETs 214 and 216 are coupled together at a common node 232, which is coupled to the supply voltage VDD through the drain to source current path provided by FET 212. The gate of FET 212 receives the clock signal. The drain of FET 214 is coupled to common node 228, and the drain of FET 216 is coupled to common node 230. In the preferred embodiment FETs 212, 214, and 216 are of the p-channel type.

The second bistable cell 217 comprises a FET 218 having its drain coupled to node 228 and its source coupled to ground, and a FET 220 having its drain coupled to node 230 and its source also coupled to ground. The gate of FET 218 is coupled to the drain of FET 220, and the gate of FET 220 is coupled to the drain of FET 218 (i.e., they are cross coupled). A first output, Q, is provided at node 228 and a second output, Q', is provided at node 230. In the preferred embodiment, FETs 218 and 220 are of the n-channel type. The circuit comprising FETs 212, 214, 216, 218, and 220 is the "slave" portion of the flip-flop 200.

The operation of flip-flop 200 is as follows. When the clock signal swings high, n-channel FET 210 conducts more current from its drain at common node 226 to its grounded source, and the master portion of flip-flop 200 is enabled. Likewise, since p-channel FET 212 conducts less current, the slave portion of the flip-flop 200 is disabled. If input D is at a higher potential, and D' is at a lower potential, node 222 is pulled-down toward ground potential through the drain to source paths of FETs 206 and 210. When the potential at node 222 drops below the supply potential plus the negative threshold voltage of p-channel FET 204, that FET turns on, raising the potential at node 224 which is substantially isolated from ground by FET 208. As the potential at node 224 rises higher FET 202 conducts less current, substantially isolating node 222 from VDD. Thus, once the bistable cell 201 changes state there is no contention problem at either node 222 or node 224 because neither node is pulled toward opposite logic states.

When the clock signal swings low, n-channel FET 210 conducts substantially less current, while p-channel FET 212 conducts more current. Therefore, the master portion of flip-flop 200 is disabled, and the slave is enabled. With the master portion disabled, the potential at node 222 is held low by parasitic capacitances, while the potential at node 224 is driven high by p-channel FET 204. Thus, p-channel FET 214 conducts more, and FET 216 conducts less and node 228 is charged to a higher potential through the drain to source current paths of FETs 212 and 214. While node 230 is substantially isolated from VDD by FET 216. As the potential at node 228 exceeds ground potential plus the positive threshold voltage of n-channel FET 220, that FET turns on and pulls down the potential at node 230 toward ground potential. When the potential at node 230 drops, n-channel FET 218 conducts less, substantially isolating node 228 from ground. Thus, input D is transferred to output Q when the clock signal swings from a high state to a low state, and so the flip-flop 200 is falling-edge triggered. A similar analysis for the opposite case applies when D is low and D' is high.

The cross-coupled configuration used in the first and second bistable cells enables the gate/drain output nodes to switch values very quickly in a complementary fashion when a new value is forced on one of the gate/drain output nodes by a pull-down or pull-up circuit. Since one of the gate/drain output nodes of either bistable cell is in a high-impedance state (i.e., not driven strongly into either logic state) for half of the clock cycle when its associated pull-up or pull-down network is disabled, the flip-flop 200 is not fully static (i.e., it is dynamic). In addition, the flip-flop 200 acts as a differential amplifier during high-frequency operation since none of the FETs may ever be fully "off" or "on" and, consequently, none of the nodes may swing fully between VDD and ground.

Figure 2A:
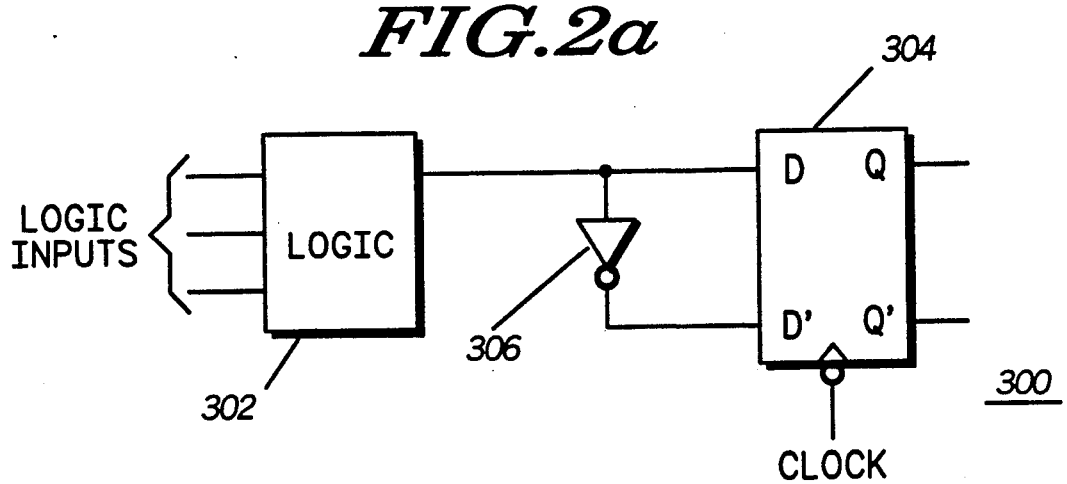
FIG. 2A shows a block diagram of a logic circuit coupled to the subject flip-flop.

Referring to FIG. 2A, a block diagram 300 shows a logic circuit 302, having several logic inputs, with its output coupled to provide data, D, to a first input of a flip-flop 304 in accordance with the present invention. The block diagram 300 also shows an inverter 306 coupled between the output of logic circuit 302 and a second input of the flip-flop 304, to receive the complement (D') of the signal D. The flip-flop 304 also has a pair of complementary outputs for providing signals Q and Q'.

Figure 2B:
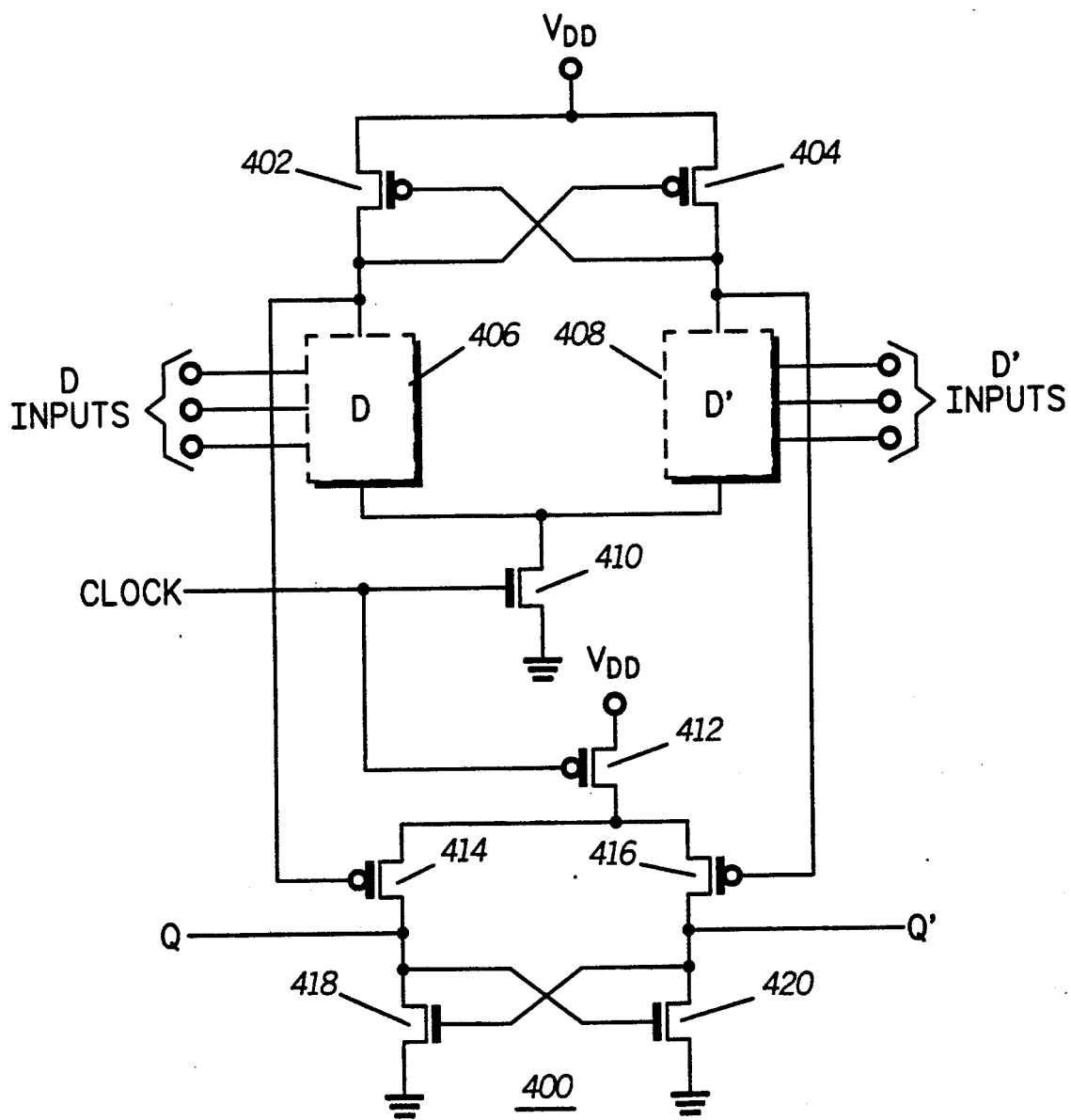
FIG. 2B shows another preferred embodiment of the invention where the logic functions of FIG. 2A have been integrated into the flip-flop circuit.

Referring to FIG. 2B, a flip-flop circuit 400, in accordance with the invention, is shown. The flip-flop circuit 400 is identical to the flip-flop circuit 200, illustrated in FIG. 1B, except for the control means 406 and 408, which provide for multiple complementary inputs. It is advantageous to integrate logic functions in the flip-flop circuit 400 to obtain maximum operating speeds, because discrete logic gates add delay in a circuit. Moreover, such integration reduces the total number of transistors and the layout area required to perform the desired task. The flip-flop circuit 400 achieves those advantages by substituting n-channel logic implementations for FETs 206 and 208 of FIG. 1B.

Figure 3A:
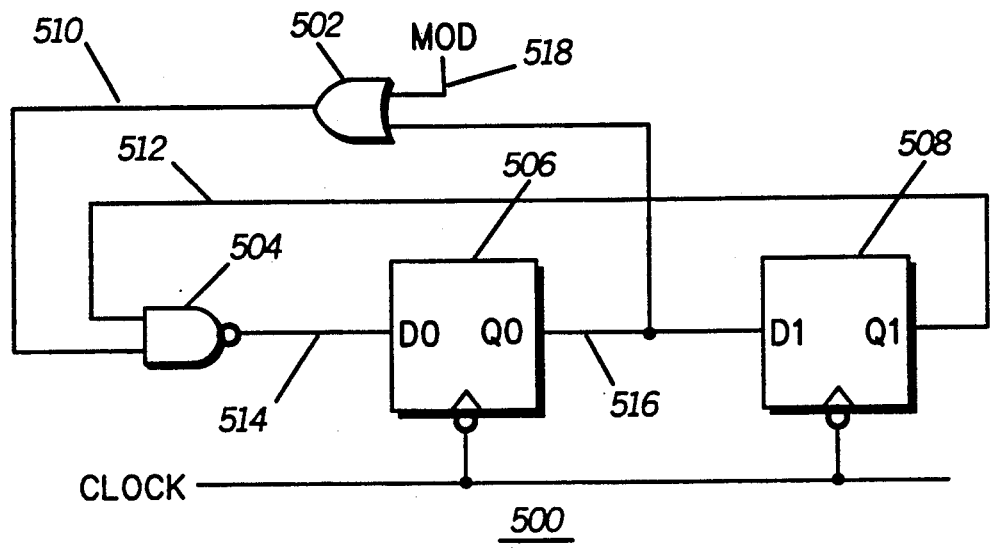
FIG. 3A shows a simple divide-by-¾ counter.

Referring to FIG. 3A, a simple divide-by-$\frac{3}{4}$ counter 500, is shown. A modulus signal is applied at one input 518 of OR gate 502. The output of OR gate 502 is supplied at an input 510 to NAND gate 504. The output of NAND gate 504, is supplied to an input 514 of a first flip-flop 506. The output of first flip-flop 506 is applied to the input 516 of a second flip-flop 508 and is also "fed back" to another input of OR gate 502. The output of second flip-flop 508 is fed back to the other input 512 of NAND gate 504.

Figure 3B:
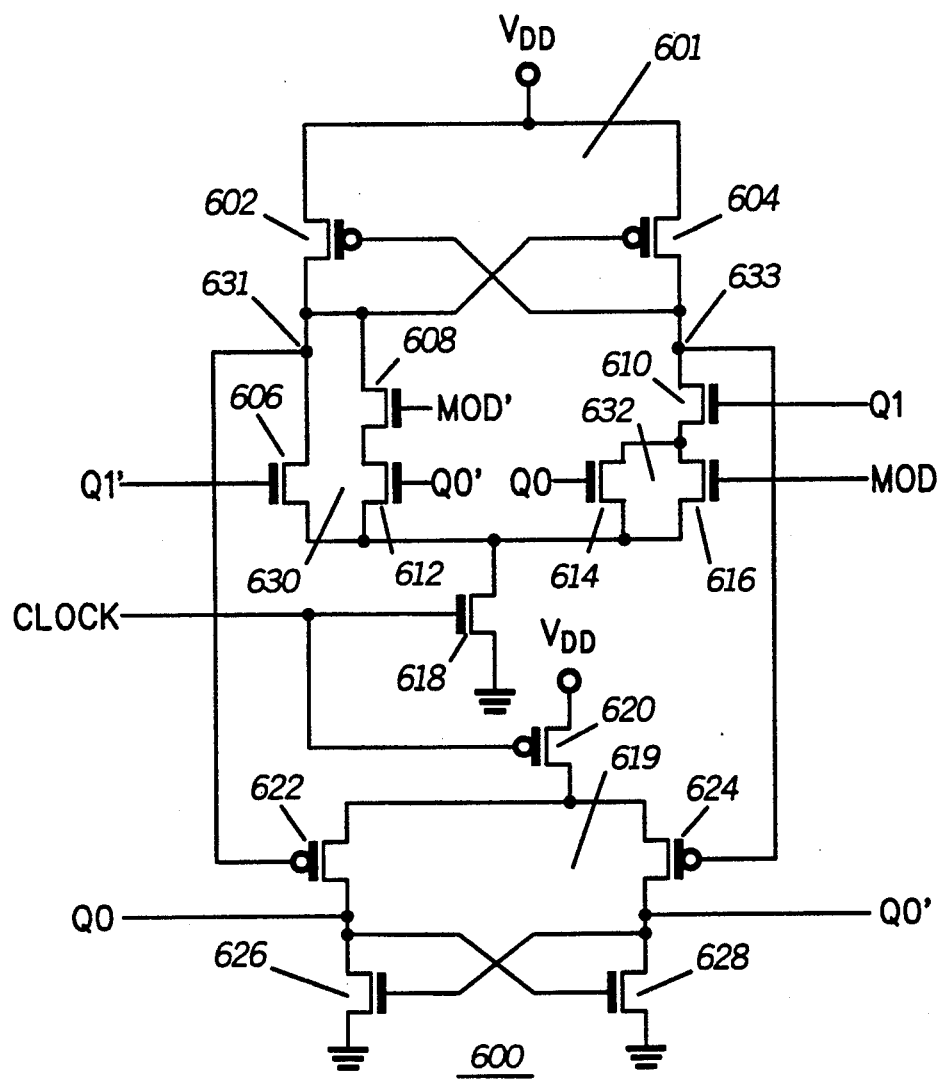
FIG. 3B shows a schematic illustrating how the OR and NAND functions in the counter may be integrated in the first (left) flip-flop.

FIG. 3B illustrates how the OR and NAND functions of FIG. 3A can be integrated in the first flip-flop 506, resulting in the new flip-flop 600, which operates similarly to the flip-flop depicted in FIG. 1B.

Figure 4:
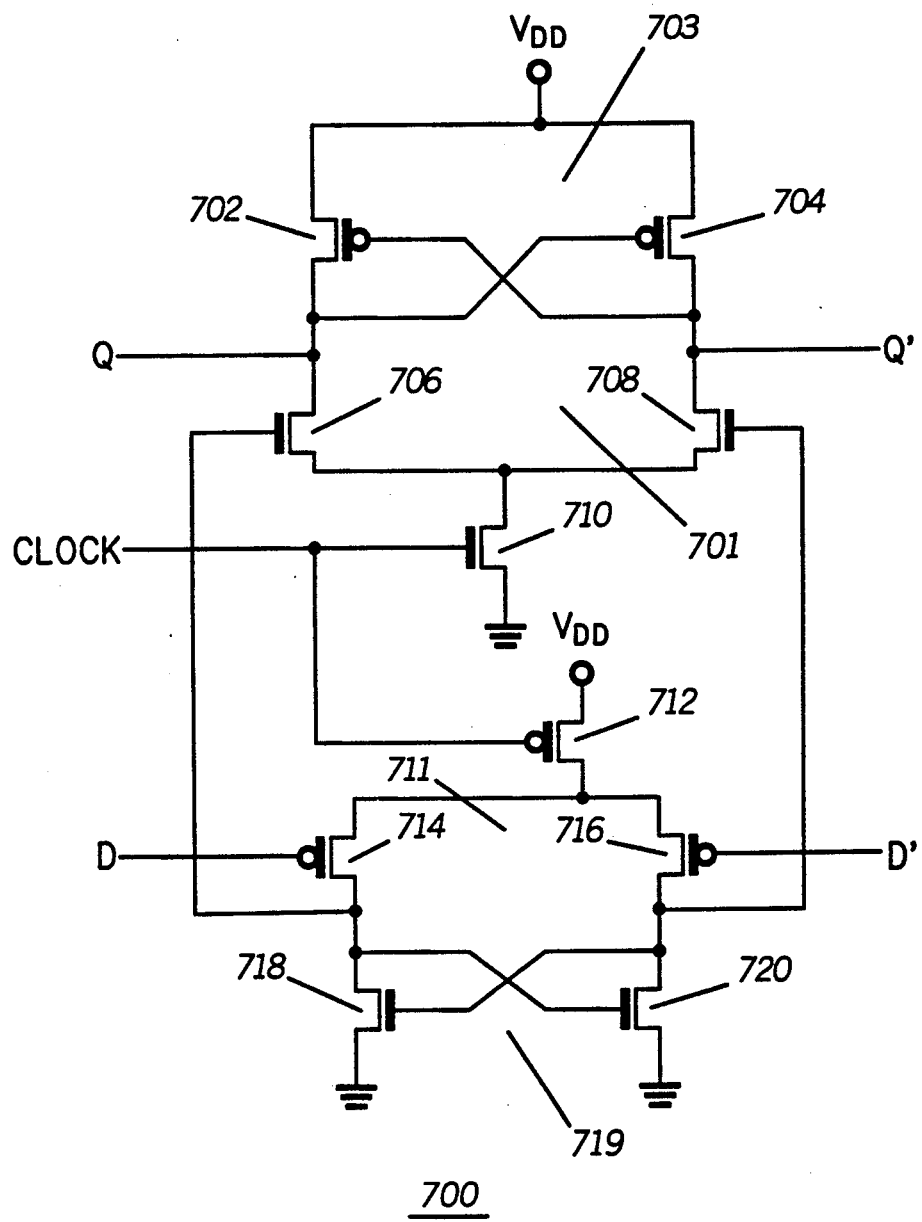
FIG. 4 shows another embodiment of the invention where the master and slave portions of the subject flip-flop have been inverted.

Referring to FIG. 4, the master and slave portions of the flip-flop depicted in FIG. 1B have been interchanged in a flip-flop 700. Such a change is possible because of the symmetry between the master and slave portions of the flip-flop of the present invention. Thus, in the embodiment of FIG. 4, cross-coupled FETs 702 and 704, and FETs 712, 714, and 716 are all p-channel type FETs; whereas, cross-coupled FETs 718 and 720, and FETs 706, 708, and 710 are all n-channel FETs. The slave portion 701 of flip-flop 700 comprises a cross coupled cell 703 comprising FETs, 702 and 704. Whereas, FETs 706, 708, and 710 are coupled to form a pull-down circuit for changing the state of the first cell in response to the outputs of the master portion 711 of the flip-flop 700 and to the clock signal. The master portion 719 of the flip-flop 700 comprises a cross-coupled cell 719 having FETs 718 and 720. The state of cell 719 is controlled by a pull-up control circuit comprising FETs 712, 714, and 716. FETs 712 and 716 have their gates coupled to receive data and the complement of that data, respectively. The use of the pull-down FET 710 in the slave portion and the pull-up FET 712, (of complementary types) ensures that the master portion 719 is enabled when the slave portion is disabled, and vice versa.

What is claimed is:

1. A flip-flop comprising:

a first dynamic bistable cell having first and second complementary outputs;

first control means coupled to said first cell for changing the state of said first cell, said first control means further comprising:

first input means for receiving data;

second input means, coupled to said first input means and coupled to receive the complement of said data; and first enabling means coupled to receive a clock signal for enabling said first control means in response to said clock signal;

a second bistable cell having first and second complementary outputs;

second control means coupled to said second cell for changing the state of said cell, said second control means further comprising:

third input means coupled to the first output of said first cell;

fourth input means coupled to said third input means and to the second output of said first cell;

second enabling means coupled to said clock signal for enabling said second control means in response to said clock signal.

2. The flip-flop of claim 1, wherein:

said first cell comprises first and second cross-coupled field effect transistors (FETs), each having a gate and first and second electrodes;

said first input means comprises a third FET, having a gate and first and second electrodes, said third FET having its gate coupled to receive data and its first electrode coupled to the second electrode of said first FET at a first common node;

said second input means comprises a fourth FET, having a gate and first and second electrodes, with its gate coupled to receive the complement of said data and its first electrode coupled to the second electrode of said second FET at a second common node, said third and fourth FETs having their second electrodes coupled together at a third common node;

said first enabling means comprises a fifth FET, having a gate and first and second electrodes, with its gate coupled to receive the clock signal, its first electrode coupled to said third common node;

said second enabling means of said second input means, comprises a sixth FET, having a gate and first and second electrodes, with its gate coupled to receive the clock signal;

said third input means comprising a seventh FET, having a gate and first and second electrodes, with its gate coupled to said first common node;

said fourth input means comprises an eighth FET, having a gate and first and second electrodes, with its gate coupled to said second common node and its first electrode coupled with the first electrode of said seventh FET to the second electrode of said sixth FET;

said second cell comprises:

a ninth FET, having a gate and first and second electrodes, with its first electrode coupled to the second electrode of said seventh FET;

a tenth FET, having a gate and first and second electrodes, cross-coupled with said ninth FET and having its first electrode coupled to the second electrode of said eighth FET.

3. The flip-flop of claim 2, wherein said fifth and sixth FETs are of complementary types.

4. The flip-flop of claim 2, wherein the type of said first and second FETs is the complement of the type of said fifth FET.

5. The flip-flop of claim 2, wherein the type of said ninth and tenth FETs is the complement of the type of said sixth FET.

6. The flip-flop of claim 3, wherein the type of said third and fourth FETs is the same as the type of said fifth FET.

7. The flip-flop of claim 3, wherein the type of said seventh and eighth FETs is the same as the type of said sixth FET.

8. The flip-flop of claim 7, wherein:

said first and second FETs have their first electrodes coupled to a potential supply;

said fifth FET has its second electrode coupled to ground potential;

said ninth and tenth FETs have their second electrodes coupled to ground potential; and said sixth FET has its first electrode coupled to the potential supply.

9. The flip-flop of claim 7, wherein:

said first and second FETs have their first electrodes coupled to ground potential;

said fifth FET has its second electrode coupled to a potential supply;

said ninth and tenth FETs have their second electrodes coupled to the potential supply; and said sixth FET has its first electrode coupled to ground potential.

10. A flip-flop comprising:

a first bisable cell having first and second complementary outputs;

first control means coupled to said first cell for changing the state of said first cell, said first control means further comprising:

first input means for receiving data;

second input means coupled to said first input means and couped to receive the complement of said data; and first enabling means coupled to receive a clock signal for enabling said first control means in response to said clock signal;

a second dynamic bistable cell having first and second complementary outputs;

second control means coupled to said second cell for changing the state of said cell, said second control means further comprising:

third input means coupled to the first output of said first cell fourth input means coupled to said third input means and coupled to the second output of said first cell;

second enabling means means coupled to receive said clock signal for enabling said second control means in response to said clock signal.

11. The flip-flop of claim 10, wherein:

said first cell comprises first and second cross-coupled field effect transistors (FETs), each having a gate and first and second electrodes;

said first input means comprises a third FET, having a gate and first and second electrodes, said third FET having its gate coupled to receive data and its first electrode coupled to the second electrode of said first FET at a first common node;

said second input means comprises a fourth FET, having a gate and first and second electrodes, with its gate coupled to receive the complement of said data and its first electrode coupled to the second electrode of said second FET at a second common node, said third and fourth FETs having their second electrodes coupled together at a third common node;

said first enabling means comprises a fifth FET, having a gate and first and second electrodes, with its gate coupled to receive the clock signal, its first electrode coupled to said third common node;

said second enabling means of said second input means, comprises a sixth FET, having a gate and first and second electrodes, with its gate coupled to receive the clock signal;

said third input means comprising a seventh FET, having a gate and first and second electrodes, with its gate coupled to said first common node;

said fourth input means comprises an eighth FET, having a gate and first and second electrodes, with its gate coupled to said second common node and its first electrode coupled with the first electrode of said seventh FET to the second electrode of said sixth FET;

said second cell comprises:

a ninth FET, having a gate and first and second electrodes, with its first electrode coupled to the second electrode of said seventh FET;

a tenth FET, having a gate and first and second electrodes, cross-coupled with said ninth FET and having its first electrode coupled to the second electrode of said eighth FET.

12. The flip-flop of claim 11, wherein said fifth and sixth FETs are of complementary types.

13. The flip-flop of claim 11, wherein the type of said first and second FETs is the complement of the type of said fifth FET.

14. The flip-flop of claim 11, wherein the type of said ninth and tenth FETs is the complement of the type of said sixth FET.

15. The flip-flop of claim 12, wherein the type of said third and fourth FETs is the same as the type of said fifth FET.

16. The flip-flop of claim 12, wherein the type of said seventh and eighth FETs is the same as the type of said sixth FET.

17. The flip-flop of claim 16, wherein:
said first and second FETs have their first electrodes coupled to a potential supply;
said fifth FET has its second electrode coupled to ground potential;
said ninth and tenth FETs have their second electrodes coupled to ground potential; and
said sixth FET has its first electrode coupled to the potential supply.

18. The flip-flop of claim 16, wherein:
said first and second FETs have their first electrodes coupled to ground potential;
said fifth FET has its second electrode coupled to a potential supply;
said ninth and tenth FETs have their second electrodes coupled to the potential supply; and
said sixth FET has its first electrode coupled to ground potential.

19. A flip-flop comprising:
a first bistable cell having first and second complementary outputs;
first control means coupled to said first cell for changing the state of said first cell, said first control means further comprising:
first input means for receiving data;
second input means, coupled to said first input means and coupled to receive the complement of said data; and
first enabling means, coupled to receive a clock signal, for enabling said first control means in response to said clock signal said first enabling means consisting essentially of a circuit for pulling down the potential at the outputs of said first bistable cell toward ground potential, in response to said clock signal;
a second bistable cell having first and second complementary outputs;
second control means coupled to said second cell for changing the state of said cell, said second control means further comprising:
third input means coupled to the first output of said first cell;
fourth input means coupled to said third input means and to the second output of said first cell;
second enabling means coupled to said clock signal for enabling said second control means in response to said clock signal.

20. The flip-flop of claim 19, wherein:
said first cell comprises first and second crosscoupled field effect transistors (FETs), each having a gate and first and second electrodes;
said first input means comprises a third FET, having a gate and first and second electrodes, said third FET having its gate coupled to receive data and its first electrode coupled to the second electrode of said first FET t a first common node;
said second input means comprises a fourth FET, having a gate and first and second electrodes, with its gate coupled to receive the complement of said data and its first electrode coupled to the second electrode of said second FET at a second common node, said third and fourth FETs having their second electrodes coupled together at a third common node;
said first enabling means comprises a fifth FET, having a gate and first and second electrodes, with its gate coupled to receive the clock signal, its first electrode coupled to said third common node;
said second enabling means of said second input means, comprises a sixth FET, having a gate and first and second electrodes, with its gate coupled to receive the clock signal;
said third input means comprising a seventh FET, having a gate and first and second electrodes, with its gate coupled to said first common node;
said fourth input means comprises an eighth FET, having a gate and first and second electrodes, with its gate coupled to said second common node and its first electrode coupled with the first electrode of said seventh FET to the second electrode of said sixth FET;
said second cell comprises:
a ninth FET, having a gate and first and second electrodes, with its first electrode coupled to the second electrode of said seventh FET;

a tenth FET, having a gate and first and second electrodes, cross-coupled with said ninth FET and having its first electrode coupled to the second electrode of said eighth FET.

21. The flip-flop of claim 20, wherein said fifth and sixth FETs are of complementary types.

22. The flip-flop of claim 20, wherein the type of said first and second FETs is the complement of the type of said fifth FET.

23. The flip-flop of claim 20, wherein the type of said ninth and tenth FETs is the complement of the type of said sixth FET.

24. The flip-flop of claim 21, wherein the type of said third and fourth FETs is the same as the type of said fifth FET.

25. The flip-flop of claim 21, wherein the type of said seventh and eighth FETs is the same as the type of said sixth FET.

26. The flip-flop of claim 25, wherein:
said first and second FETs have their first electrodes coupled to a potential supply;
said fifth FET has its second electrode coupled to ground potential;
said ninth and tenth FETs have their second electrodes coupled to ground potential; and
said sixth FET has its first electrode coupled to the potential supply.

27. The flip-flop of claim 25, wherein:
said first and second FETs have their first electrodes coupled to ground potential;
said fifth FET has its second electrode coupled to a potential supply;
said ninth and tenth FETs have their second electrodes coupled to the potential supply; and
said sixth FET has its first electrode coupled to ground potential.

28. A flip-flop comprising:
a first bistable cell having first and second complementary outputs;
first control means coupled to said first cell for changing the state of said first cell, said first control means further comprising:
first input means for receiving data;
second input means, coupled to said first input means and coupled to receive the complement of said data; and
first enabling means, coupled to said clock signal, for enabling said first control means in response to said clock signal said first enabling means consisting essentially of a circuit for pulling up the potential at the outputs of said first bistable cell toward supply potential, in response to said clock signal;
a second bistable cell having first and second complementary outputs;
second control means coupled to said second cell for changing the state of said cell, said second control means further comprising:
third input means coupled to the first output of said first cell;
fourth input means coupled to said third input means and to the second output of said first cell;
second enabling means coupled to said clock signal for enabling said second control means in response to said clock signal.

29. The flip-flop of claim 28, wherein:
said first cell comprises first and second cross-coupled field effect transistors (FETs), each having a gate and first and second electrodes;
said first input means comprises a third FET, having a gate and first and second electrodes, said third FET having its gate coupled to receive data and its first electrode coupled to the second electrode of said first FET at a first common node;
said second input means comprises a fourth FET, having a gate and first and second electrodes, with its gate coupled to receive the complement of said data and its first electrode coupled to the second electrode of said second FET at a second common node, said third and fourth FETs having their second electrodes coupled together at a third common node;
said first enabling means comprises a fifth FET, having a gate and first and second electrodes, with its gate coupled to receive the clock signal, its first electrode coupled to said third common node;
said second enabling means of said second input means, comprises a sixth FET, having a gate and first and second electrodes, with its gate coupled to receive the clock signal;
said third input means comprising a seventh FET, having a gate and first and second electrodes, with its gate coupled to said first common node;
said fourth input means comprises an eighth FET, having a gate and first and second electrodes, with its gate coupled to said second common node and its first electrode coupled with the first electrode of said seventh FET to the second electrode of said sixth FET;
said second cell comprises:
a ninth FET, having a gate and first and second electrodes, with its first electrode coupled to the second electrode of said seventh FET;
a tenth FET, having a gate and first and second electrodes, cross-coupled with said ninth FET and having its first electrode coupled to the second electrode of said eighth FET.

30. The flip-flop of claim 29, wherein said fifth and sixth FETs are of complementary types.

31. The flip-flop of claim 29, wherein the type of said first and second FETs is the complement of the type of said fifth FET.

32. The flip-flop of claim 29, wherein the type of said ninth and tenth FETs is the complement of the type of said sixth FET.

33. The flip-flop of claim 30, wherein the type of said third and fourth FETs is the same as the type of said fifth FET.

34. The flip-flop of claim 30, wherein the type of said seventh and eighth FETs is the same as the type of said sixth FET.

35. The flip-flop of claim 34, wherein:
said first and second FETs have their first electrodes coupled to a potential supply;
said fifth FET has its second electrode coupled to ground potential;
said ninth and tenth FETs have their second electrodes coupled to ground potential; and
said sixth FET has its first electrode coupled to the potential supply.

36. The flip-flop of claim 34, wherein:
said first and second FETs have their first electrodes coupled to ground potential;
said fifth FET has its second electrode coupled to a potential supply;
said ninth and tenth FETs have their second electrodes coupled to the potential supply; and
said sixth FET has its first electrode coupled to ground potential.

* * * * *